(12) United States Patent
Barlage et al.

(10) Patent No.: US 12,148,838 B2
(45) Date of Patent: Nov. 19, 2024

(54) ACTIVE VIA

(71) Applicant: ZINITE CORPORATION, Vancouver (CA)

(72) Inventors: Douglas W. Barlage, Edmonton (CA); Lhing Gem Shoute, Edmonton (CA)

(73) Assignee: ZINITE CORPORATION, Vancouver (CA)

( * ) Notice: Subject to any disclaimer, the term of this patent is extended or adjusted under 35 U.S.C. 154(b) by 0 days.

(21) Appl. No.: 18/403,268

(22) Filed: Jan. 3, 2024

(65) Prior Publication Data

US 2024/0136330 A1    Apr. 25, 2024

Related U.S. Application Data

(63) Continuation of application No. PCT/IB2022/056397, filed on Jul. 11, 2022.

(Continued)

(51) Int. Cl.
| | |
|---|---|
| *H01L 29/786* | (2006.01) |
| *H01L 23/48* | (2006.01) |
| *H01L 23/528* | (2006.01) |
| *H01L 23/552* | (2006.01) |
| *H01L 25/065* | (2023.01) |
| *H01L 25/16* | (2023.01) |

(Continued)

(52) U.S. Cl.
CPC ...... *H01L 29/78618* (2013.01); *H01L 23/481* (2013.01); *H01L 23/5286* (2013.01); *H01L 23/552* (2013.01); *H01L 25/0657* (2013.01); *H01L 25/16* (2013.01); *H01L 27/0248* (2013.01); *H01L 29/66969* (2013.01); *H01L 29/78603* (2013.01); *H01L 29/78642* (2013.01); *H01L 29/7869* (2013.01); *H01L 2225/06541* (2013.01)

(58) Field of Classification Search
None
See application file for complete search history.

(56) References Cited

U.S. PATENT DOCUMENTS

| | | | |
|---|---|---|---|
| 2010/0237386 A1* | 9/2010 | Lin | ........................ H01L 23/60 |
| | | | 257/E23.141 |
| 2015/0137368 A1 | 5/2015 | Pelto et al. | |

(Continued)

FOREIGN PATENT DOCUMENTS

| | | |
|---|---|---|
| CN | 108091624 A | 5/2018 |
| CN | 108109996 A | 6/2018 |
| WO | WO-2017052650 A1 * | 3/2017 ..... H01L 21/823821 |

*Primary Examiner* — Sarah K Salerno
(74) *Attorney, Agent, or Firm* — Perry + Currier Inc.

(57) ABSTRACT

An active via is taught which comprises at least one via and at least one transistor which acts as a switch element. The resulting active via can be used with 1D, 2.5D or 3D chips to: control circuit elements; reduce EMI between vias; increase the density of vias; improve power and thermal efficiencies of chips; simplify power, data and other routing networks on chips; enable a higher level stacking of dies or layers in a chip while maintaining modularity; etc. A control strategy system can be provided to remove the supply of power to one or more regions of the chip when the regions are not in use and to supply power to those regions when the regions are in use, or to control input and output to regions of the chip. The active vias can be fabricated with Back or Front End Of Line processes.

9 Claims, 7 Drawing Sheets

Related U.S. Application Data

(60) Provisional application No. 63/221,292, filed on Jul. 13, 2021.

(51) Int. Cl.
  *H01L 27/02* (2006.01)
  *H01L 29/66* (2006.01)

(56) References Cited

U.S. PATENT DOCUMENTS

| | | |
|---|---|---|
| 2020/0006575 A1* | 1/2020 | Dewey ................ H01L 29/7869 |
| 2020/0096558 A1 | 3/2020 | Ide |
| 2020/0098930 A1* | 3/2020 | Le ......................... H01L 29/458 |
| 2020/0098931 A1* | 3/2020 | Sharma ............... H01L 27/0688 |
| 2021/0156908 A1 | 5/2021 | Yang |

\* cited by examiner

ACTIVE VIA

PRIORITY

This application claims convention priority benefit from U.S. provisional patent application 63/221,292, filed Jul. 13, 2021, and the contents of this earlier application are incorporated herein, by reference, in their entirety.

FIELD OF THE INVENTION

The present invention relates to semiconductor integrated circuits. More specifically, the present invention relates to an active via for use in semiconductor integrated circuits and chips.

BACKGROUND OF THE INVENTION

Much effort is expended by the semiconductor industry to increase the utility and functionality of semiconductor integrated circuits by increasing their capabilities, with a commensurate increase in their complexity and size. For example, the recent M1 Max integrated circuit designed by Apple has over fifty-seven billion transistors and includes multiple processor cores and specialized processors such as a graphics processing unit.

Due to the size and complexity of such integrated circuits (commonly referred to as a "chip"), components within a "chip" are often electrically linked using interconnects, typically called "vias". Local interconnects provide connectivity within the local circuit (e.g. between layers within the die on which the integrated circuit is formed), and global interconnects enable connectivity between different dies (i.e. dies/circuits fabricated on different wafers or by different companies, etc.).

In particular, through-silicon vias ("TSV") enable the manufacture of an integrated circuit, such as a 2.5D or 3D integrated circuit ("3DIC"), by vertically connecting two or more otherwise discrete circuits into a single package.

Conventional vias, both local and global, are passive circuit elements. With such vias, the only control over the circuit elements connected by the conventional via is in the selection of the via's intrinsic characteristics (size, resistivity, etc.), which cannot be further modified by applying an external force (e.g. voltage bias, current bias, etc.).

However, as chip designs become more complex, control and management of various parts of the chips becomes more challenging and the required management circuits include components such as RAM, memory controllers, power networks, etc., which are often referred to as "uncore" components. As the complexity of the chip increases, a corresponding increase in the complexity and size of the uncore components also occurs.

Further, there is a limit on how many conventional vias can be used within a chip. Specifically, placing two or more vias close together can cause electromagnetic interference ("EMI") issues, such as crosstalk between the two or more conventional vias.

As the complexity of a chip increases, the probability of EMI, such as cross talk between conventional vias also increases due to the proximity of the vias to each other. Specifically, electrically coupled vias (inductive coupling between tiers within the chip) or pseudo-electrically coupled vias (resulting from a combination of inductive coupling and physical connection) can result, especially from attempts to reduce the area required for the uncore components.

In attempts to reduce EMI, in some cases the via sizes may be changed, or more process layers may be added to the chip, to construct a conventional via (such as a co-axial via). The additional insulating layers are intended to reduce electromagnetic coupling and thus reducing crosstalk between the conventional vias, but such changes incur additional manufacturing costs and/or design compromises.

As well, the processing steps to manufacture conventional vias require a "keep-out-zone" (KoZ) around the via, further reducing the area available for core components. In some cases, the need for a KoZ as large as two times the diameter of the via arises. This is due to the fact that conventional vias typically require process steps which are performed at relatively high temperatures and such temperatures can change the characteristics of neighboring components significantly, which may be detrimental to the circuit element. For example, the characteristics of the neighboring components that can be thus affected include timing violations as signals pass through the vias.

While conventional vias play a critical role in the migration of signals, whether related to data, power supplies or other functions, between circuit elements in chips, the challenges and disadvantages associated with conventional vias still remain.

A further limitation of conventional vias relates to the power consumption of chips. Specifically, to reduce power consumption of the overall chip (such as system-on-a-chip "SoC", or a system-in-package "SiP" and similar variants), "control strategies" such as "dark silicon" management, or input/output management are typically implemented to reduce the power draw of regions of a chip which are not in used for a given function.

Further still, conventional vias do not provide any electrostatic protection or signal suppression between regions, sections, tiers within a chip The various implementations of control strategies have a common approach where either a specific voltage at a set frequency signal (dynamic voltage scaling or DVS technique), or a specific frequency at a set voltage signal (dynamic frequency scaling or DFS technique), or a unique combination of a voltage-frequency signal (dynamic voltage-frequency scaling or DVFS technique) is sent from the management circuit, through a conventional via, such as a TSV, to a region, or regions, of a chip to place it into an "idle mode" thereby reducing its power draw. In the case where its function is required, through the same mechanism, a signal is sent from the management circuit to the remove the region, or regions, of the chip from idle mode.

However, while such control strategies can somewhat reduce the power requirements of a chip, the regions of the chip which are in idle mode at any time still draw power, albeit at a reduced level.

Accordingly, it is desired to have an active via which can mitigate or avoid at least some of these issues.

SUMMARY OF THE INVENTION

It is an object of the present invention to provide a novel active via which obviates or mitigates at least one of the disadvantages of the prior art.

According to a first aspect of the present invention, there is provided an active via for use in a chip, the active via comprising: a via having a first end and a second end; a switch element integrated with the via, the switch element comprising at least one transistor, the at least one transistor having a source contact, a drain contact and a gate contact, wherein the source contact is in electrical contact with a first circuit element of a chip, the drain contact is in electrical contact with a second circuit element of a chip and the gate contact is in electrical contact with a third circuit element of a chip, and wherein when one of the first, second or third circuit elements applies a voltage to its respective connected contact, the source contact and the drain contact are electrically connected when the at least one transistor forms a channel.

Preferably, the at least one transistor is a thin film transistor. Also preferably, the thin film transistor has a vertical channel. Also preferably, the via can be a local via or a global via. Also preferably, the active via acts as a circuit element.

According to another aspect of the present invention, there is provided a chip comprising a plurality of regions, each region capable of performing at least one particular circuit function, comprising: a control strategy circuit; at least one active via connected to each respective region, each active via operable to provide at least one signal to each respective region; and wherein, when the circuit function performed by a region is not required, the control strategy circuit turns off the at least one active via supplying the at least one signal to the region and, when the circuit function performed by a region is required, the control strategy circuit turns on the at least one active via supplying the at least one signal to the region.

Preferably, the at least one signal comprises a supply of power to the respective region. Also preferably, the active via is formed in Back End of Line processes.

According to another aspect of the present invention there is provided a chip comprising: at least a first region and second region of circuit elements, each region implementing a circuit function; at least one active via connecting the first and second regions; a control system to alter the state of the active via between ON and OFF states.

The present invention provides a novel active via including one or more vias and a thin film transistor switch element. The active via can be employed on 1D, 2.5D and/or 3D chips to: control circuit elements; reduce or eliminate EMI between vias, such as adjacent TSVs; increase the density of vias; improve power and thermal efficiencies of semiconductor circuits; simplify power, data and other routing networks on chips; enable a higher level stacking of dies or layers while maintaining modularity; etc. Further, by using the disclosed thin film transistor, the active vias of the present invention can be fabricated with Back End of Line processes, or Front End of Line Processes.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

As is understood by those of skill in the art, most semiconductor devices are manufactured in a series of steps wherein substantially planar layers of material are formed, portions of those layers subsequently being removed, treated and/or replaced with subsequent layers to obtain the desired semiconductor device. Accordingly, as used herein, the terms "horizontal" and "vertical" are used with respect to the plane of those layers, with horizontal referring to a direction largely parallel to the plane of the layers and vertical referring to a direction largely orthogonal to the plane of the layers. Similarly, the terms "up", "down", "on", "under" or the like are also used with respect to those planar layers. In particular, as used herein with respect to the channel formed in a transistor, the term "vertical" is intended to include all orientations of such a channel which are not substantially parallel to the plane of those layers.

Further, the manufacturing of those layers and/or features of semiconductor devices described herein is referred to herein as "forming" those layers and/or features and, as will be apparent to those of skill in the art, "forming" is intended to comprise all semiconductor manufacturing techniques suitable and applicable therefor including, without limitation: deposition (chemical, atomic layer, physical vapor, etc.); sputtering; PECVD (Plasma Enhanced Chemical Vapor Deposition); implantation and annealing, oxidation; etc. as will be apparent to those of skill in the art.

Also, as used herein the term "chip" is used in a broad sense and is intended to include both 1D (conventional planar semiconductor dies), 2.5D (separate circuit dies or chips which are joined in a subsequent process step) and 3D (multiple semiconductor circuits "stacked" atop one another on the same die) devices.

Figure 1:
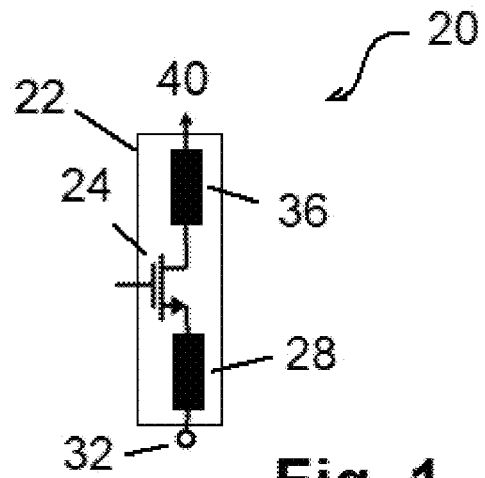
FIG. 1 is a schematic representation of an active via.

An active via, in accordance with an embodiment of the present invention, is indicated generally at 20 in FIG. 1. Active via 20 can be switched between an ON state, wherein signals are passed through it, and an OFF state wherein signals are not passed. In a presently preferred aspect, active via 20 is formed by BEOL compatible processes, as will be described in more detail below.

Active via 20 includes a via 22, such as a local via, global via or through silicon via and a switch 24, in this example a thin film FET transistor ("TFT"), described in more detail below, having a source terminal 28 connected to a signal source 32, a drain terminal 36 connected to a signal destination 40 and a gate terminal 44, used to turn switch 24, and hence via 20, on or off. While in the illustrated example of FIG. 1, switch 20 is illustrated as a single transistor, but the present invention is not so limited and, if desired, switch 20 can comprise two or more transistors combined in common drain, common source, cascade and other configurations as desired, as further discussed below.

As will be apparent to those of skill in the art, when a voltage is applied to gate terminal 44 of switch 24, active via 20 is placed into an ON state to enable signals to pass from signal source 32 to signal destination 40. In the absence of a voltage applied to gate terminal 44, active via 20 is in an OFF state and signals cannot pass from signal source 32 to signal destination 40. Signals controlled by active via 20 can include power supplied to signal destination 40, data signals, etc.

Active via 20 can be turned OFF when it is not in use, and can accordingly control circuit elements (including uncore components) by turning regions, sections or tiers of such elements on or off. This provides various advantages such as an increased density of vias, improved power and thermal efficiencies of semiconductor circuits, simplified power, data and other routing networks on the semiconductor circuit, higher level stacking of dies or layers while maintaining modularity, among many others.

Further, use of active vias 20 can provide the advantage of significantly reducing or eliminating the problem of EMI, such as crosstalk and isolation between multiple vias. As well, with the use of active vias 20, the size of KoZs can be reduced. Another advantage of active vias 20 can include improved thermal stability, and improved predictability of circuit operation at/about active vias 20.

Perhaps even more significantly, use of active vias 20 can provide the advantage of significantly reducing power consumption of a chip by minimizing the power consumption of the regions of a chip not in use when the active via, or the active via gating power to the specific region or regions of the chip, is OFF.

Further, active vias constructed with high standoff voltage characteristics can provide electrostatic protection between regions of a packaged chip, especially if certain regions are more sensitive than neighboring regions separated, for example, by a via such as a TSV, where the neighboring region operates at a higher voltage.

Figure 2:
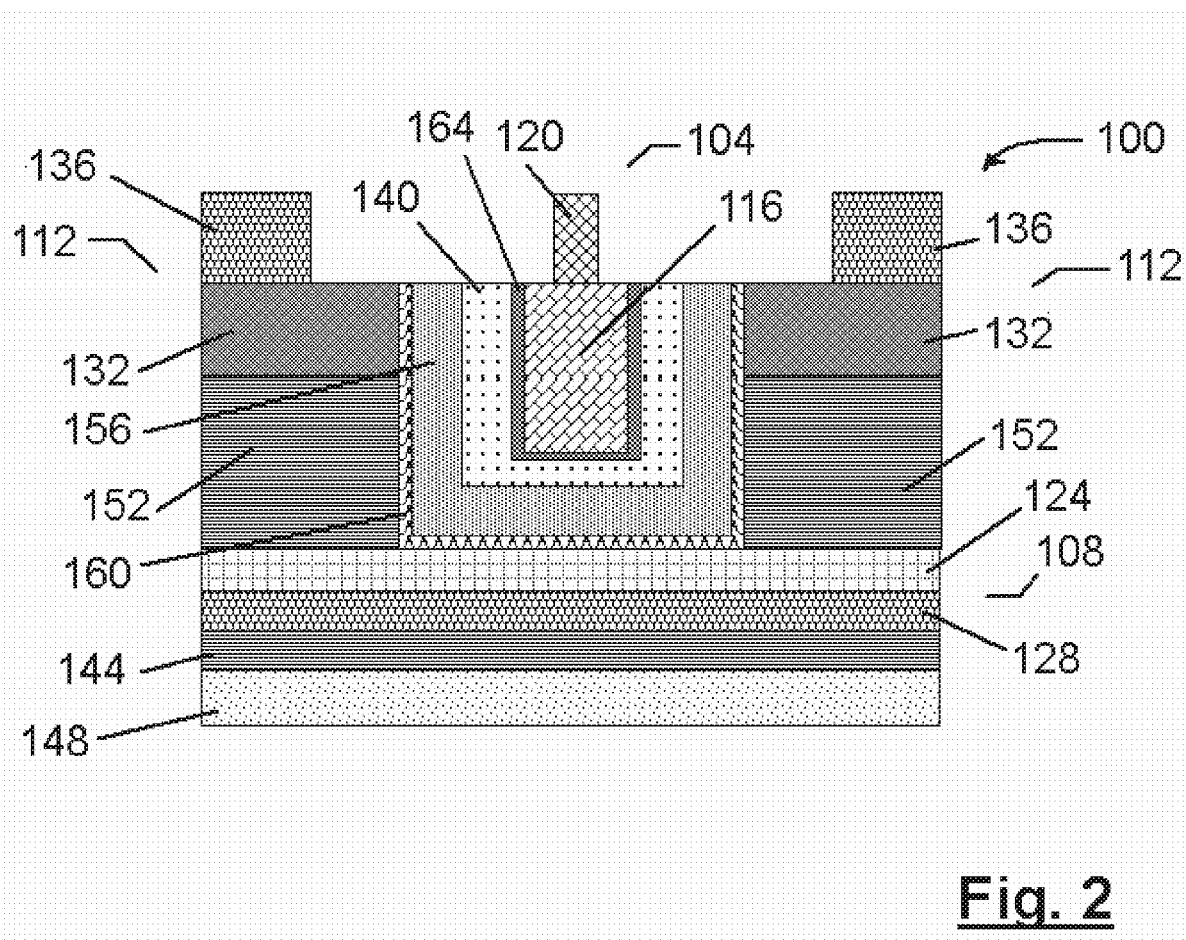
FIG. 2 shows an example of a vertical thin film transistor for use with the active via of FIG. 1.

FIG. 2 shows the general structure of a TFT 100 which can be used as switch 24 in accordance with an aspect of the present invention. While TFT 100 is presently preferred for use with active via 20, as it features a vertical channel (i.e.—the conductive region through the semiconductor layer when TFT 100 is ON), the present invention is not so limited and any suitable transistor, as would occur to those of skill in the art, can be employed.

TFT 100 includes a gate 104, a source 108 and a drain 112. Gate 104 includes a gate contact 116 and a gate electrode 120, source 108 includes a source contact 124 and a source electrode 128, and drain 112 includes a drain contact 132 and a drain electrode 136. TFT 100 also includes a dielectric layer 140 about gate 104 of TFT 100 and includes a first insulation layer 144 formed over a substrate 148 (which can be any suitable substrate, including an interlayer dielectric layer which can include interlayer dielectric layers containing vias), and a second insulation layer 152. TFT 100 further includes a semiconductor layer 156 and, if required, a source-channel interfacial member 160. If desired, TFT 100 can also include a gate tuning layer 164 as illustrated.

In TFT 100, the contacts and electrodes of the drain, source and gate can be formed of the same materials, or the materials can be separately selected, as desired. For example, source contact 124 can be formed from a material selected for its desired Work function, while source electrode 128 can be selected from a material better suited to connection to other components of a circuit, such as metallization layers, etc.

Semiconductor layer 156 is a semiconductor material which is selected to preferably allow it to be formed at temperatures below 400 degrees centigrade. Examples of suitable materials include, without limitation, zinc oxide, tin oxide, indium gallium oxide, gallium oxide, germanium oxide, etc.

Unlike prior art thin film transistors, TFT 100 can include source-channel interfacial member 160 formed between source contact 124 and semiconductor layer 156 and which electrically connects source contact 124 and semiconductor layer 156. Source-channel interfacial member 160 is formed of a material selected to serve as a carrier transport barrier, resulting in substantially no current flow through semiconductor layer 156 when TFT 100 is in an 'OFF' state.

Source-channel interfacial member 160 can be a semiconductor, an induced piezoelectric dipole, a controllable tunneling barrier or other mechanism to modulate injected current by an external applied field. The method of forming source-channel interfacial member 160 is not particularly limited. For example, source-channel interfacial member 160 can consist of elemental germanium or source-channel interfacial member 160 can be formed by using an opposite polarity dopant in a relevant portion of semiconductor layer 156. In other cases, source-channel interfacial member 160 consists of an oxide or a sulfide, or another element corresponding to group VI(A) of the periodic table, or the chalcogens, such as oxygen, sulfur, selenium, tellurium, ruthenium or polonium.

Source-channel interfacial member 160 can also be formed by a catalytic growth of the material that forms source contact 124. In other cases, source-channel interfacial member 160 can be formed by depositing an opposite polarity dopant, such as a p-type metal oxide or an n-type semiconductor or vice versa, by way of a deposition technique, such as atomic layer deposition, sputtering physical vapor deposition or chemical vapor deposition.

Dielectric layer 140 separates gate contact 116 from semiconductor layer 156. Dielectric layer 140 impedes the flow of electrons into gate contact 116, allowing carriers to form a channel between source contact 124 and drain contact 132 with a large concentration of electrons. Dielectric layer 140 can consist of materials such as, for example: hafnium oxide (HfO2); zirconium dioxide ($ZrO_2$); silicon dioxide ($SiO_2$); silicon nitride ($Si_3N_4$); or any other suitable material as would occur to those of skill in the art.

TFT 100 can also include an optional gate tuning layer 164. Gate tuning layer 164 can be an atomic layer of metal that is used to adjust the effective barrier height and/or Work function of the gate contact 116, as desired, as will be apparent to those of skill in the art.

In TFT 100, typically each of gate electrode 120, source electrode 128 and drain electrode 136 are formed of highly conducting metals, such as copper or aluminum, that are used to electrically connect the corresponding electrode to the appropriate elements of the rest of the integrated circuit in which TFT 100 is formed.

TFT 100 also includes an insulation layer 144 formed over substrate 148 (which itself can be an interlayer dielectric layer). Substrate 148 serves as the foundation for the construction of components and devices, such as transistors and integrated circuits, and insulation layer 144 is a dielectric separating substrate 148 from source contact 144. Examples of insulation layer 144 can include materials such as: silicon dioxide ($SiO_2$); silicon nitride ($Si_3N_4$); aluminum oxide ($Al_2O_3$); etc.

As described above, source-channel interfacial member 160 serves to create a repository of opposing excess charge or a barrier that functions to deplete the channel in at least the region of semiconductor layer 156 adjacent source contact 124. In TFTs fabricated in accordance with embodiments of the present invention, such as TFT 100, the distance between gate contact 116 and source contact 124, through gate dielectric layer 140, semiconductor layer 156 and source-channel interfacial member 160, is selected such that the electric field induced by a voltage applied to gate contact 116 will lower the blocking potential of the repository of complimentary excess charge introduced by source-channel interfacial member 160 to place the TFT, such as TFT 100, into an CON' state. In the absence of such an applied gate voltage, the blocking potential results in the TFT being in an 'OFF' state.

TFT 100 can be fabricated with its various elements formed in ranges of thicknesses and/or lengths. As will be apparent to those of skill in the art, the primary limiting factor is that gate contact 116 must be within sufficient electrical proximity to source contact 124 such the minimum threshold voltage applied to gate 104 serves to effectively reduce the barrier to carrier flow into semiconductor layer 156 induced by source-channel interfacial member 160. Failure to induce a sufficient electric field reduces the ability to turn TFT 100 CON'. This is very similar to the well-known criteria for MOSFETs and the like, typically referred to as Ada (n) factor.

As an example of the method of manufacturing TFT 100, source formation, drain formation and gate formation can be achieved by sputtering and patterning; semiconductor layer formation can be achieved by atomic layer deposition; dielectric/insulator formation can be achieved by atomic layer deposition; and source-channel interfacial member formation can be achieved by oxidation of the source contact (if the material is an oxidizable metal) or by sputtering a degeneratively doped monoatomic semiconductor layer, such as germanium or silicon.

TFT 100 is merely one embodiment of a TFT in accordance with aspects of the present invention and, while TFT 100 shows gate 104 and drains 112 on top of TFT 100, it will now be apparent to those of skill in the art that TFTs in accordance with aspects of the present invention can also be fabricated in a variety of orientations/configurations including source and gate on top and drain on the bottom, etc.

Figure 3:
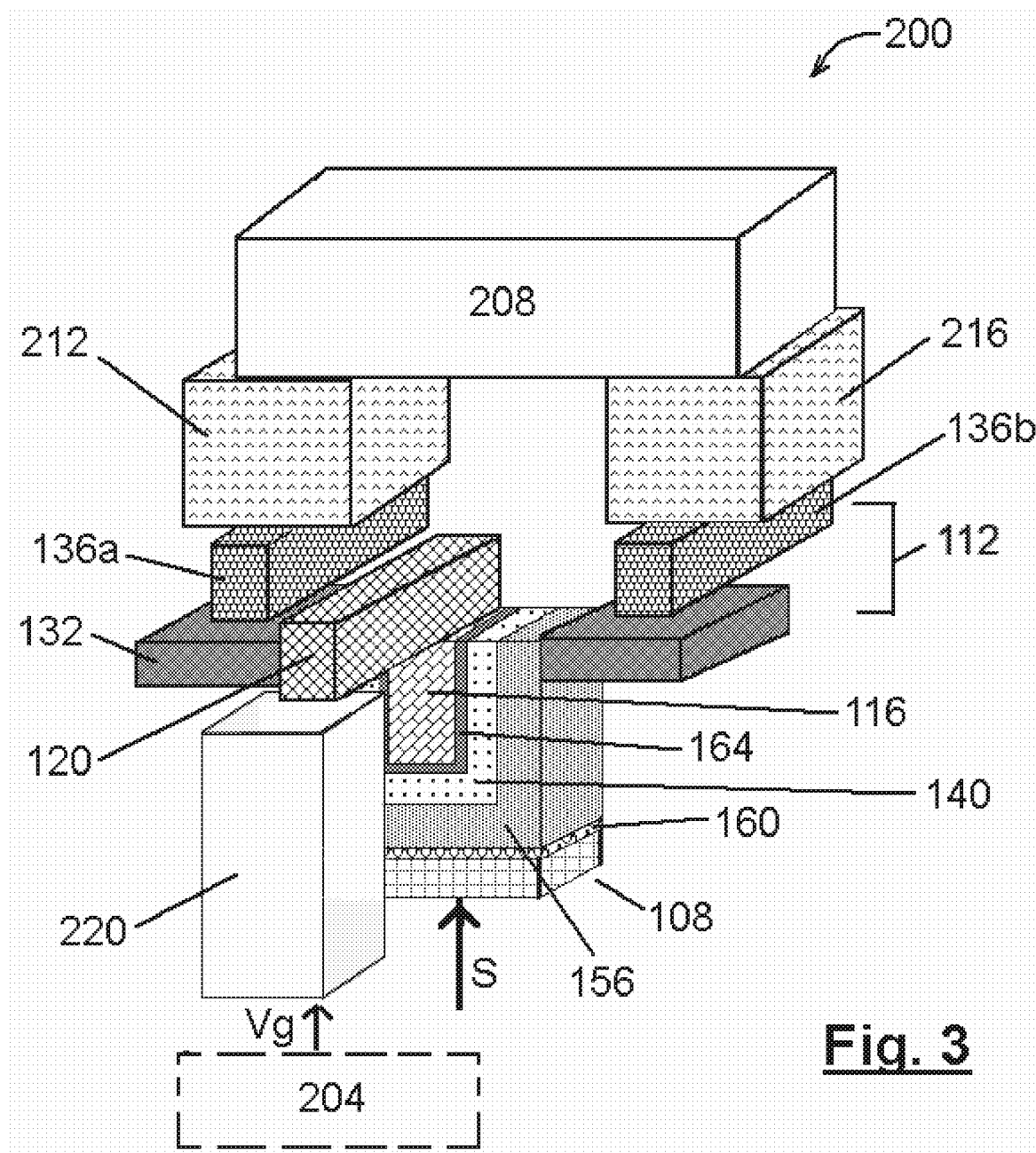
FIG. 3 shows a perspective view of an embodiment of the active via of FIG. 1.

FIG. 3 shows an active via 200, in accordance with an aspect of the present invention and which can be manufactured using BEOL-compatible processes, if desired. In the Figure, like components to those of FIG. 2 are indicated with like reference numbers. Also, first insulation layer 144 and second insulation layer 152 have been omitted from the Figure for clarity of illustration.

Active via 200 can be turned OFF when it is not in use, and can accordingly control circuit elements (including uncore components) by turning regions, sections, or tiers, of such elements ON or OFF. The use of active via 200 can provide various advantages such as increased density of vias, improved power and thermal efficiencies of chips, simplified power, data and other routing networks on the chip, higher level stacking of dies or layers while maintaining modularity, among many others. The use of active via 200 can additionally provide the advantage of drastically reducing or eliminating the problem of EMI, such as crosstalk and isolation, between multiple vias. Further, with the use of active vias 200, the size of KoZs can be reduced, thermal stability can be improved and improved predictability of circuit operation at/about the active via can be obtained.

Active via 200, or a circuit comprising multiple instances of active vias 200, is intended to be connected between circuit elements of two "chips", or regions within a chip, and, in the embodiment shown in FIG. 3, source 108 of a TFT 100 of active via 200 is connected to a first chip (not shown), either directly or through an interconnect metal to receive a signal S, and drain 112 of TFT 100 is connected to the second chip 208 using two vias, in this example TSVs, 212 and 216. TSV 212 is connected to a first drain electrode 136a and TSV 216 is connected to a second drain electrode 136b of TFT 100. TSV 212 and TSV 216 consist of a via metal, such as copper etc.

To control active via 200, gate electrode 120 is connected to a control mechanism, such as an uncore control circuit 204, by a wire 220. When it is desired to turn active via 200 ON, control circuit 204 applies a gate voltage V g to gate electrode 120, through wire 220, and signals "S" can pass from the first chip, through source 108, source-channel interfacial member 160, n-type semiconductor layer 156, drain 112 and TSVs 212 and 216 to chip 208. Conversely, when it is desired to turn active via 200 OFF, control circuit 204 removes the gate voltage V g from gate electrode 120 and TFT 100 turns OFF, preventing the transfer of signals S. As mentioned above, signal S can be a supply of power to energize the relevant region of second chip 208, or can be data or control signals intended for the region of second chip 208.

Figure 4:
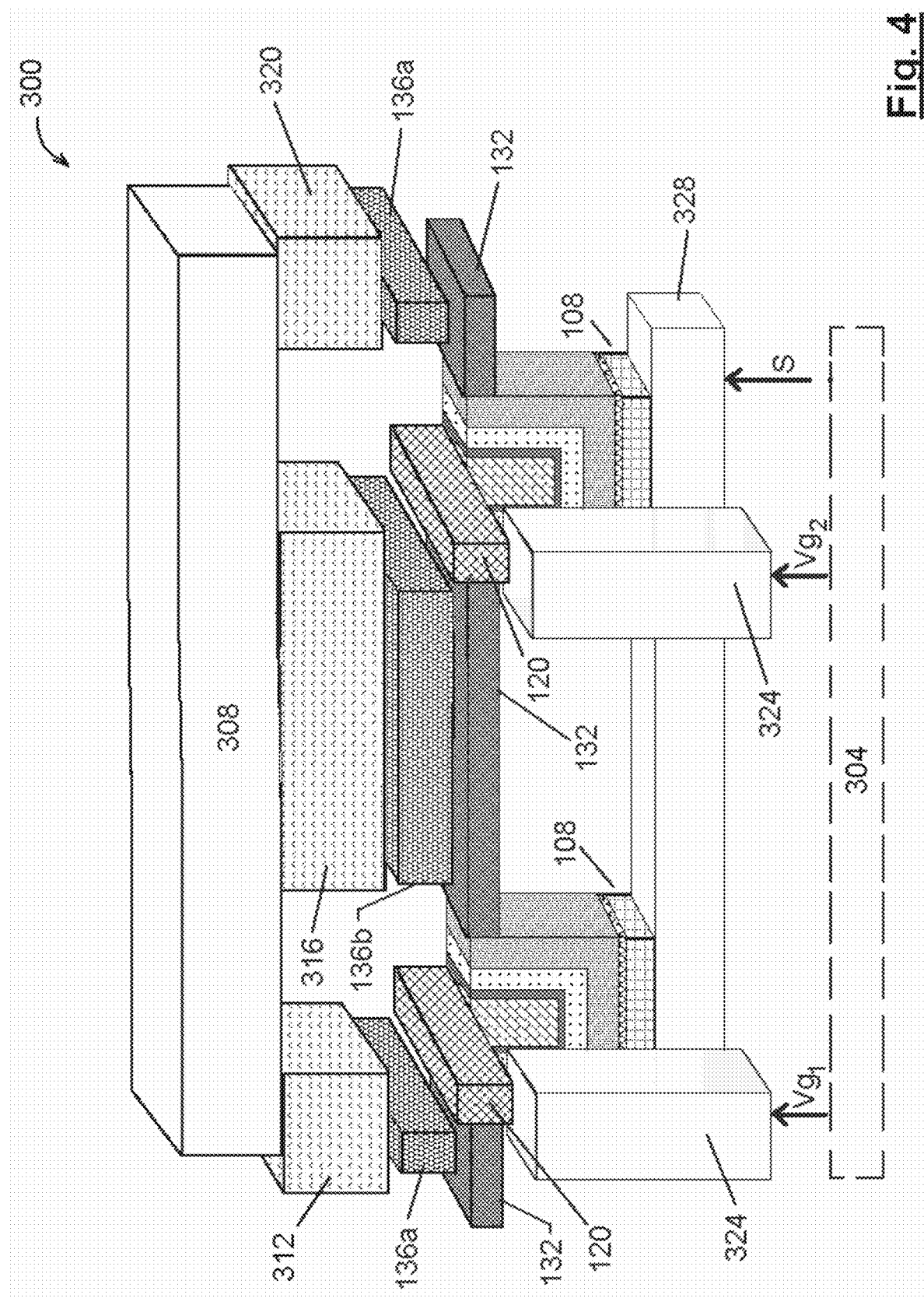
FIG. 4 shows a perspective view of another embodiment of the active via of FIG. 1.

FIG. 4 shows a perspective view of another embodiment of an active via 300, in accordance with another aspect of the present invention and insulating layers have again been omitted for clarity. Active via 300 connects a first chip (not shown) and to respective regions of a second chip 308 in a dual switch network.

Active via 300 includes a first via, such as TSV 312, a second via, such as TSV 316 and a third via, such as TSV 320. Active via 300 includes two TFTs, such as TFTs 100 described above, which are located adjacent each other and share a drain electrode 136b. As shown in this example, TSV 312 is connected to the drain electrode 136a of the first TFT and TSV 320 is connected to drain electrode 136a of the second TFT. Drain electrode 136b is connected to TSV 316 and TSV 312, TSV 316 and TSV 320 are formed of a suitable via metal, such as copper, etc. The gate electrodes 120 of the TFTs are connected to a control circuit 304 by interconnect metal 324, and the source 108 of each TFT is joined and connected to receive signal S by interconnect metal 328.

As should now be apparent to those of skill in the art, control circuit 304 can individually control the TFTs by applying $Vg_1$ and/or $Vg_2$ to the respective gate electrodes 120. If control circuit 304 supplies the gate voltage $Vg_1$, signal S will be transmitted to the respective region of chip 308 through TSVs 312 and 316. For example, if control circuit 304 supplies gate voltage $Vg_2$, signal S will transmitted to the respective region of chip 308 through TSVs 316 and 320. If control circuit 304 supplies both gate voltages, signal S will be transmitted through all three of TSVs 312, 316 and 320 to the respective regions of chip 308. If control circuit chip 304 does not supply either gate voltage, signal S will not be transmitted to the respective regions of chip 308.

As will now be apparent, if signal S is in fact the power supply to the respective regions of chip 308, control circuit 304 can very effectively control the power consumption and corresponding thermal effects of chip 308.

Figure 5:
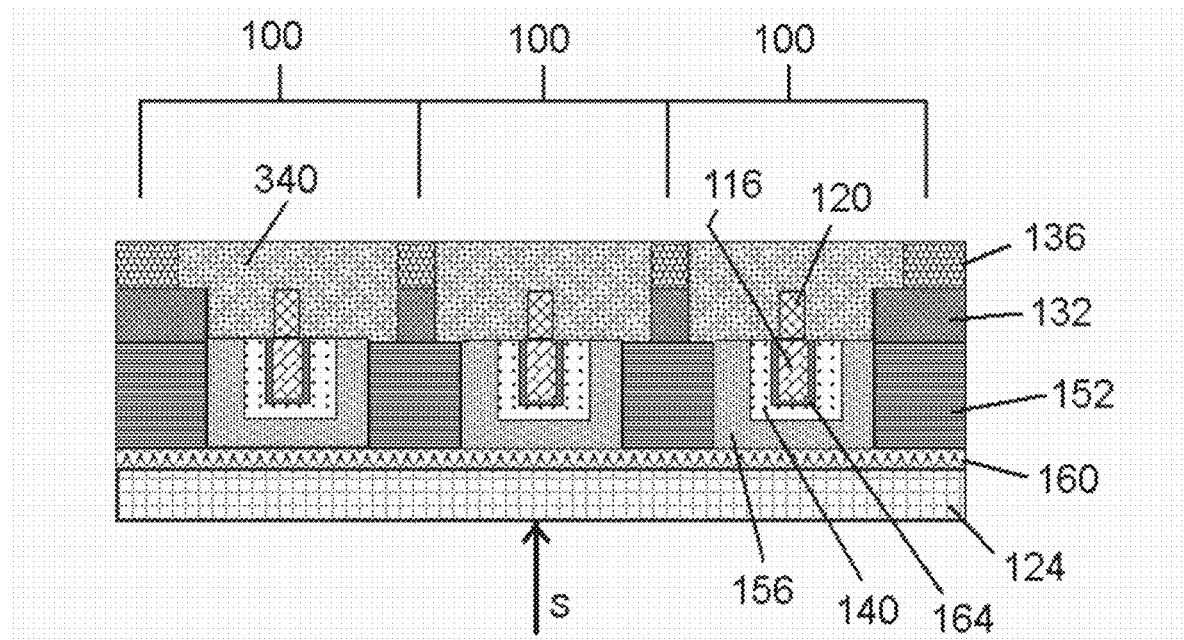
FIG. 5 shows a cross-section through an example of a portion of a network of active vias of FIG. 1.
Figure 6:
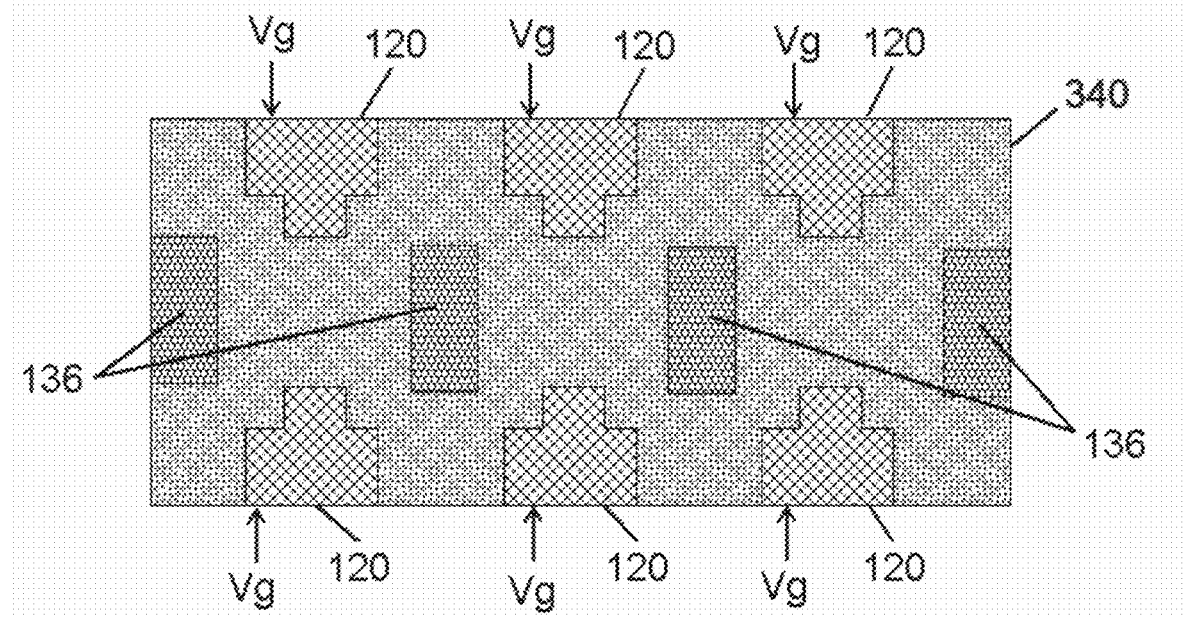
FIG. 6 shows a top view of an example of a network of active vias similar to those of FIG. 5.

Active vias 300 can be repeated, as required, to form larger networks of vias and examples of such arrangements are illustrated in the cross-sectional view of FIG. 5 and the top view of FIG. 6. In FIG. 5, three vias, such as TFTs 100, are arranged adjacent to one another, with an insulator 340 between them and their drain electrodes are interconnected by a metal 400. FIG. 6 shows the top view of an arrangement similar to that of FIG. 5 with the gate electrodes 120 and drain electrodes 136 extending through the corresponding vias.

Figure 7:
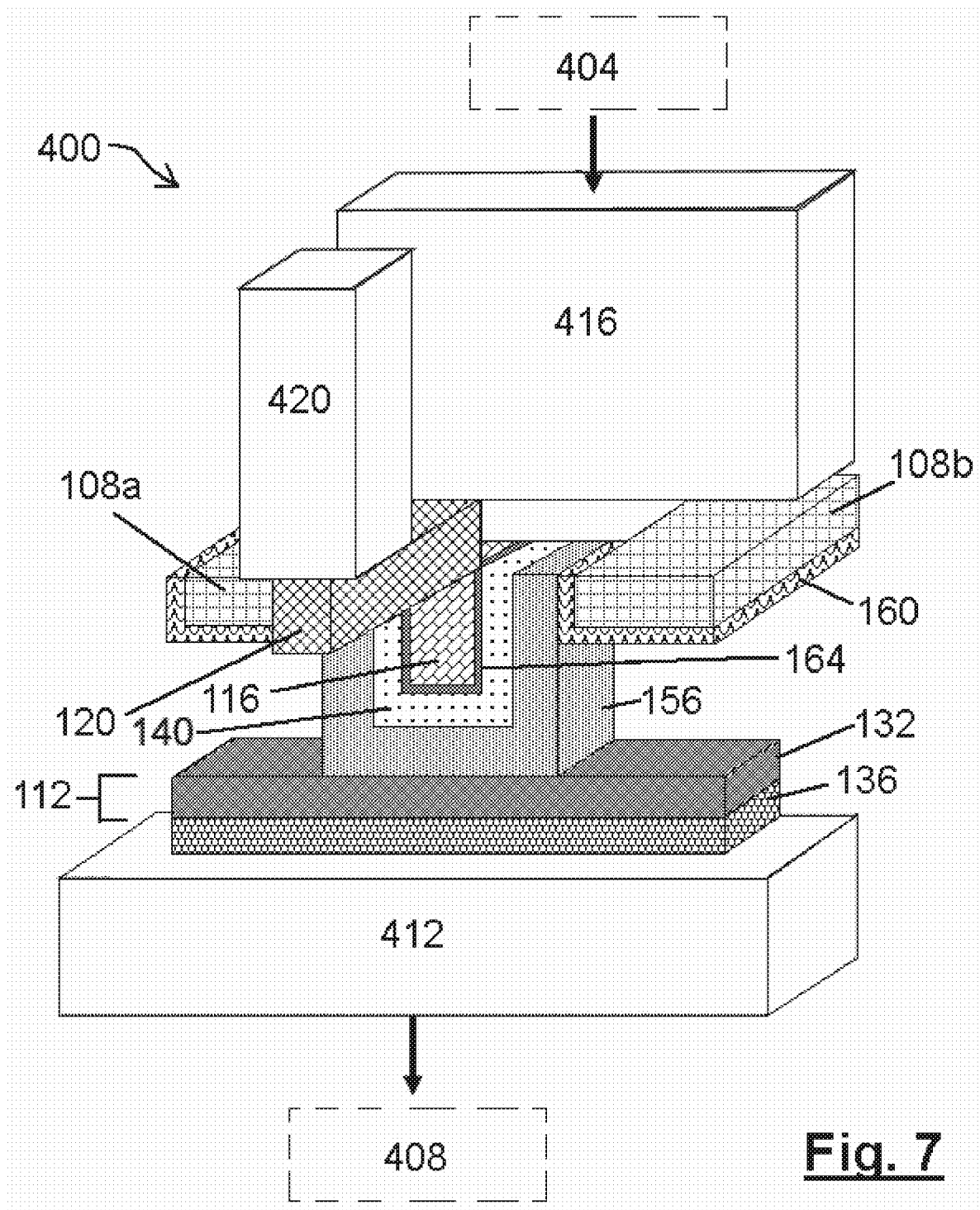
FIG. 7 shows a perspective view of another embodiment of the active via of FIG. 1.
Figure 8:
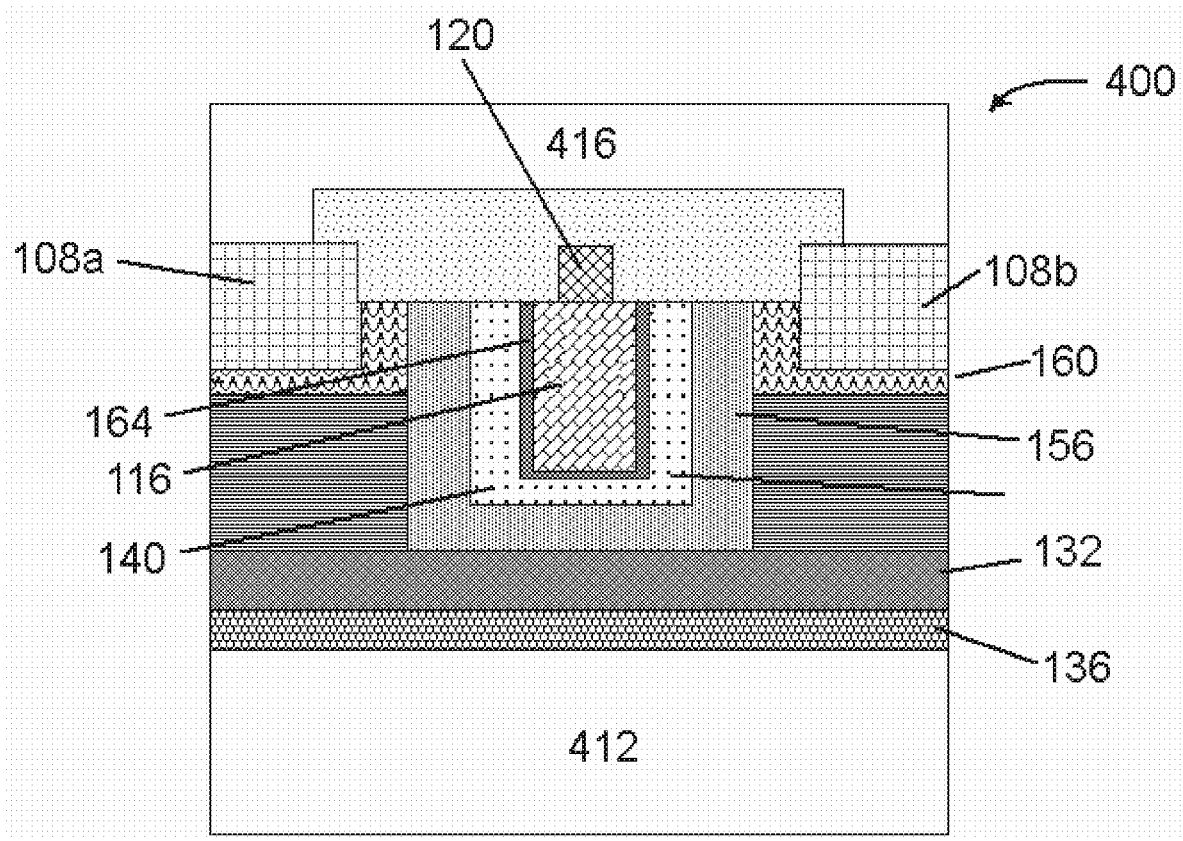
FIG. 8 shows a cross-section through a network of the active vias of FIG. 7.

FIG. 7 shows an active via 400 which employs a different configuration of a TFT, in accordance with an aspect of the present invention, specifically using a configuration of TFT wherein drain 112 is on the bottom and source (108a, 108b) and gate 120 are on top of the TFT. Active via 400 connects a first electronic chip 404 to a second electronic chip 408 using multiple through-silicon vias 412. In the illustrated embodiment, source contact 108a and source contact 108b are connected to electronic chip 404 via interconnect metal 416 and drain electrode 136 is connected to electronic chip via TSV 412. Gate electrode 120 is connected to electronic chip 404 by interconnect metal 420. FIG. 8 shows a cross-sectional view of active via 400.

A method for forming an active via in a chip, in accordance with an aspect of the present invention, such as active via 200 of FIG. 3, commences after the via has been formed in the chip. Source 108 is formed in the bottom of the via and source-channel interfacial member 160 (if present) is formed atop source 108.

For example, source 108 can be formed of copper, tungsten or any other material usable in the fabrication of a vertical transistor as will occur to those of skill in the art and, in particular, the material of source 108 is selected based on Work function in order to, in combination with source-channel interfacial member 160, provide the desired effect of the injection of electrons into the accumulation layer during operation of the active via. Source-channel interfacial member 160 can also be formed in a variety of manners and, in one embodiment, is deposited using atomic layer deposition techniques.

Next, semiconductor layer 156 is formed over source-channel interfacial member 160. Semiconductor layer 156 can be formed in a variety of manners and, in one embodiment, is deposited using atomic layer deposition techniques.

Next, a portion of semiconductor layer 156 is patterned to form a void into which gate dielectric 140 is formed. The selection of the material for dielectric layer 140 is not particularly limited and dielectric layer 140 can be any suitable material with a high dielectric constant as will be apparent to those of skill in the art.

Next a portion of dielectric layer 140 is patterned to form a void into which gate 116 is formed. Next drain contacts 132 are formed in contact with semiconductor layer 156 and gate electrode 120 is formed atop gate 116.

Finally, in this example, drain electrodes 136a and 136b are formed on drain contacts 132, aligned with vias 212 and 216.

Figure 9:
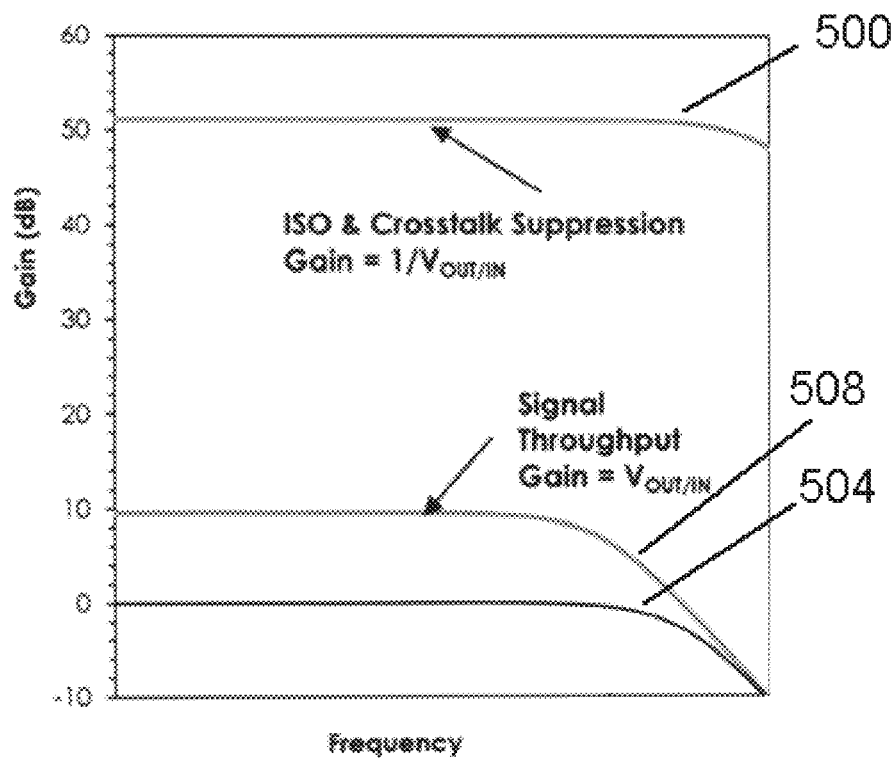
FIG. 9 shows plots comparing the performance of an active via and a passive via.

FIG. 9 is a graph representing the performance of an active via in accordance with aspects of the present invention. Plot 500 shows that, when the active via is turned off, the isolation and crosstalk suppression gain is at about 50 dB. Plot 504 shows that prior art passive vias, in contrast, provide 0 dB gain for isolation and crosstalk. The isolation and crosstalk suppression characteristics of active vias tend to boost power efficiency and thermal performance of the circuit when the active via network is off. Plot 508 shows that when an active via is turned on, the signal throughput gain is at about 10 dB at lower frequency levels while, in contrast, passive vias provide a gain of 0 dB.

The active vias of the present invention can thus also be used as a means to suppress crosstalk between adjacent circuits, allowing a significantly denser arrangement of circuits on a chip. For example, two adjacent circuits (or circuit elements) can be designed such that their input sensitivities require their inputs to be at a level which is only obtained when the input signal is amplified (perhaps by as much as 10 dB) by an active via providing the signal. Thus, when a first circuit is receiving an input signal through an active via which is amplifying it, any cross talk received at a second circuit adjacent the first will be below the input sensitivity level for that second circuit and the second circuit will not be affected.

As should now be apparent, the active vias of the present invention provide numerous advantages and/or additional features compared to conventional vias. For example, active vias can be employed to provide electrostatic protection to regions of a chip by allowing power to a region to be controlled by one or more active vias while data to or from that region can be controlled by one or more other active vias.

Similarly, the transistors used as switch 20 in the active vias of the present invention can provide a gain, as shown in FIG. 9, and thus signals provided through active vias can be amplified as desired.

In the examples above, the active via is changed between an ON state and an OFF state by applying a voltage to the gate. However, as will be apparent to those of skill in the art, the transistor, or transistors, in the active via can be configured to operate in a variety of other arrangements such as a common drain, common source, cascade or other configurations such that, for example, the state of the active via can be changed by applying a state-altering voltage to the source or drain instead, as will be apparent to those of skill in the art.

Further, because the active vias of the present invention are in fact active, they can act as circuit elements in and of themselves, either individually, or when networked together, to effectively form "mini circuits" to enable additional desired functionalities in a chip.

As should now be apparent to those of skill in the art, the active vias of the present invention provides numerous advantages over conventional vias and, in particular, can be used to obtain significant power savings (and corresponding increases in thermal efficiency/reduced cooling requirements) by allowing regions of a chip, or chips, to be substantially powered off when the active via is OFF, rather than being placed into an idle mode which still consumes substantial amounts of power. It is contemplated that, as chip complexity and circuit densities continue to increase, this ability to turn regions of chip OFF will have greater and greater significance.

Further, being active elements, the active vias of the present invention can act as circuit elements themselves, either individually or networked together, to form circuits on a chip. When the active vias of the present invention are fabricated in Back End of Line processes, circuit elements constructed with the active vias can be added to the chip during Back End of Line processes, increasing flexibility for chip designers.

The present invention provides a novel active via including one or more vias and a transistor switch element. The active vias can be employed on 1D, 2.5D and/or 3D chips to: control circuit elements; reduce or eliminate EMI between vias, including TSVs; increase the density of vias; improve power and thermal efficiencies of semiconductor circuits; simplify power, data and other routing networks on chips; enable a higher level stacking of dies or layers while maintaining modularity; etc. Further, by using the disclosed thin film transistor, the active vias of the present invention can be fabricated with Back End of Line processes, or Front End of Line Processes.

The above-described embodiments of the invention are intended to be examples of the present invention and alterations and modifications may be effected thereto, by those of skill in the art, without departing from the scope of the invention which is defined solely by the claims appended hereto.

We claim:

1. A method for forming an active via in a semiconductor die, comprising:
   forming a via through the die, the via having a first end and a second end;
   forming a source contact at the first end of the via;
   forming a source-channel interfacial member within the via and over the source contact, wherein the source-channel interfacial member includes a semiconductor material, and wherein the source-channel interfacial member is formed by oxidizing the source contact;
   forming a semiconductor layer within the via and over the source-channel interfacial member;
   forming a gate dielectric within the via and over the semiconductor layer;
   forming a gate contact within the via and over the gate dielectric;
   forming a gate electrode at the second end of the via and in contact with the gate contact to electrically connect the gate contact to a control circuit; and
   forming a drain contact at the second end of the via, the drain contact in contact with the semiconductor layer.

2. The method of claim 1 wherein the source contact is formed by sputtering.

3. The method of claim 1 wherein the semiconductor layer is formed by atomic layer deposition.

4. The method of claim 3 wherein the semiconductor layer comprises tin oxide.

5. The method of claim 1 wherein the active via is formed in a back end of line manufacturing process.

6. The method of claim 1 wherein the via is one of a local via, global via or a through silicon via.

7. The method of claim 1, wherein the semiconductor layer does not enclose the gate contact at the second end of the via, so as to expose a surface of the gate contact for connection of the gate electrode.

8. The method of claim 7, wherein the semiconductor layer does not enclose the gate contact at the second end of the via in the completed active via.

9. The method of claim 1, further comprising forming a drain electrode at the second end of the via and in contact with the drain contact, wherein the drain electrode and gate electrode are formed within the same plane.

* * * * *